United States Patent [19]
Werther

[11] Patent Number: 5,683,256
[45] Date of Patent: Nov. 4, 1997

[54] INTEGRAL THRU-HOLE CONTACTS

[75] Inventor: William E. Werther, Simi Valley, Calif.

[73] Assignee: Methode Electronics, Inc., Chicago, Ill.

[21] Appl. No.: 353,122

[22] Filed: Dec. 9, 1994

[51] Int. Cl.⁶ .................................................. H01R 9/09
[52] U.S. Cl. ................................................ 439/69; 439/225
[58] Field of Search .............................. 439/70, 69, 55, 439/82, 225

[56] References Cited

U.S. PATENT DOCUMENTS

| | | | |
|---|---|---|---|
| 4,494,172 | 1/1985 | Leary et al. | 439/444 |
| 4,519,658 | 5/1985 | Biswas | 439/70 |
| 4,676,564 | 6/1987 | Mitchell, Jr. | 439/77 |
| 5,290,191 | 3/1994 | Foreman et al. | 439/225 |

OTHER PUBLICATIONS

IBM Technical Disclosure Bulletin:Roche et al., Circuit Board Connective Scheme vol. 6, No. 8 p. 87 Jan. 8, 1964.

*Primary Examiner*—Neil Abrams
*Assistant Examiner*—Eugene G. Byrd
*Attorney, Agent, or Firm*—David L. Newman

[57] ABSTRACT

An integral thru-hole contact is provided for solderless connection of a pin inserted therein. The integral contact provides for an interconnect board of extremely low profile for interconnection with an IC package or sockets or pin grid array sockets and may provide for power/ground decoupling or voltage conversion and upgrading of microprocessors.

11 Claims, 2 Drawing Sheets

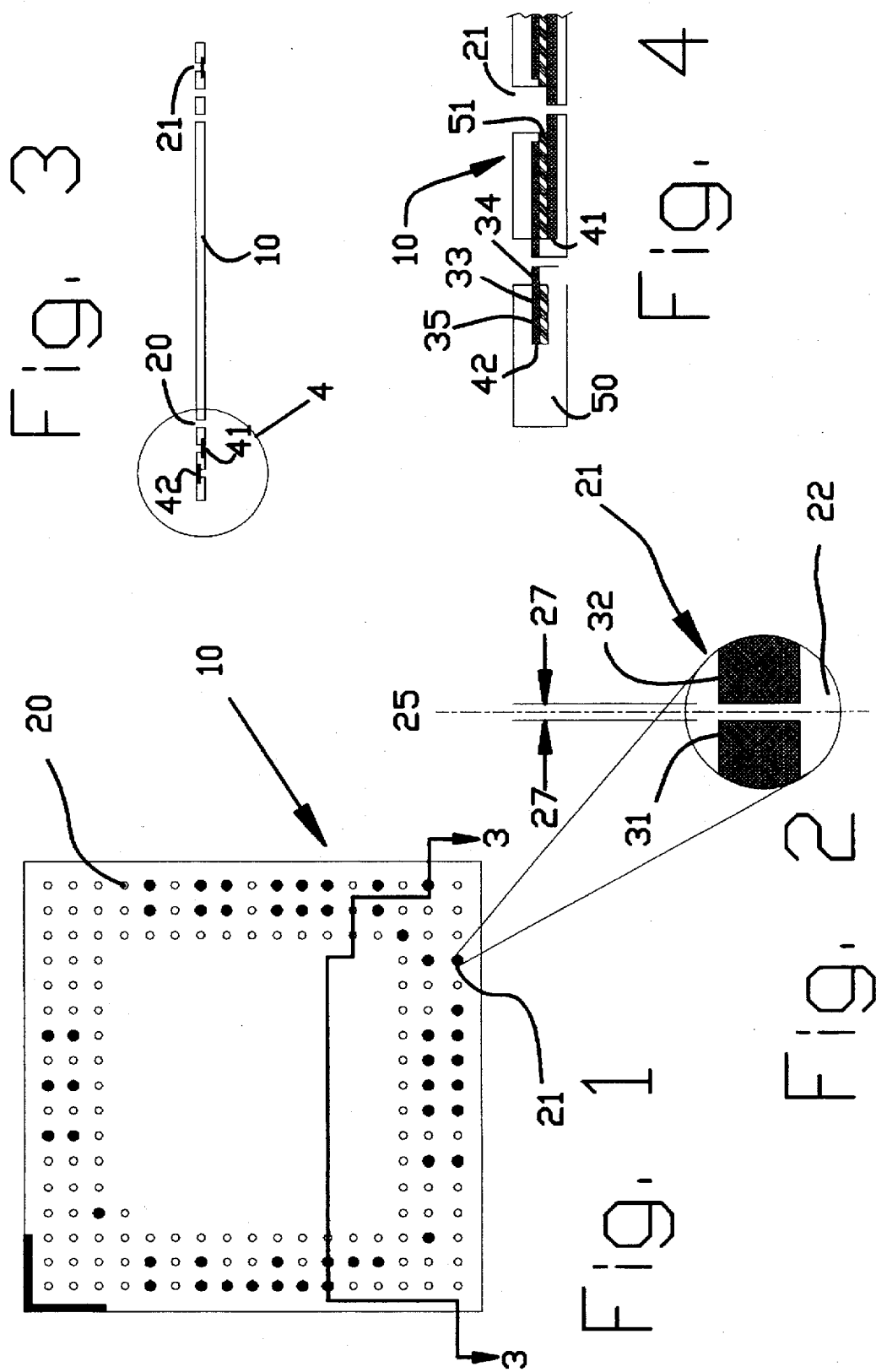

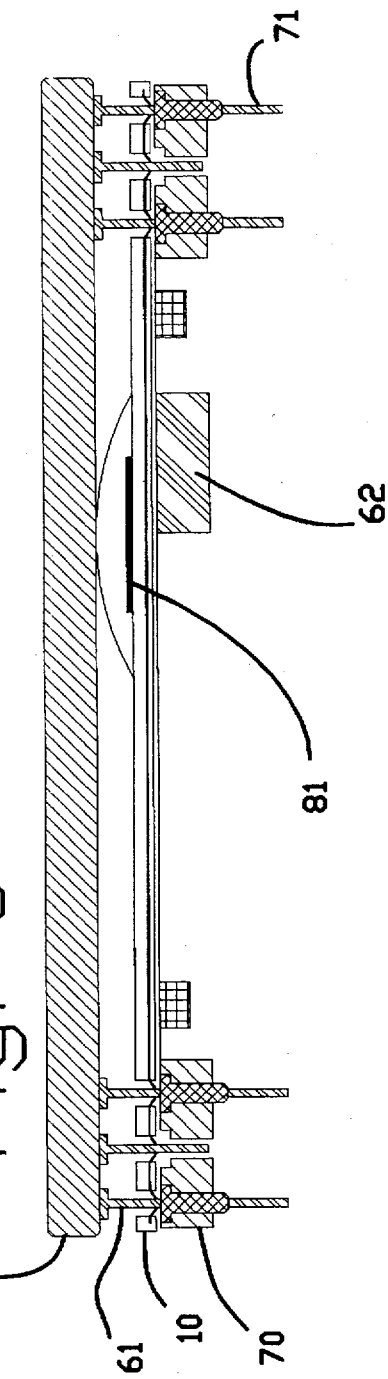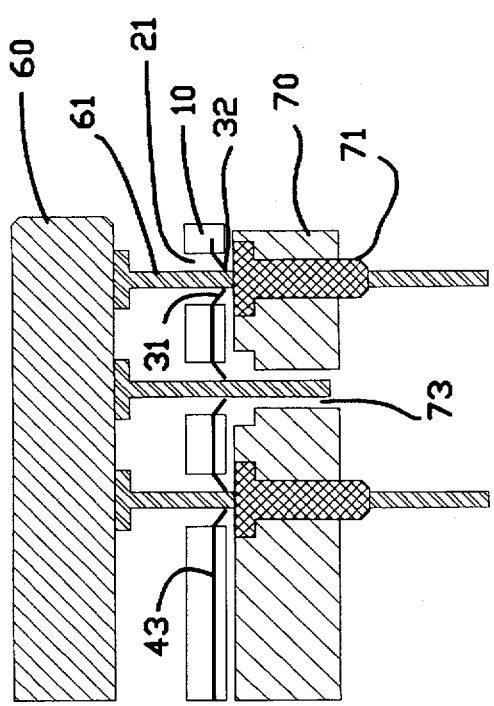

INTEGRAL THRU-HOLE CONTACTS

BACKGROUND OF THE INVENTION

This relates generally to integral thru-hole contacts and in particular, an interconnect board having integral thru-hole contacts.

Plated thru-holes are well-known in the art and provide for a means for electrically connecting a pin of a device such as an integrated circuit package (IC package) to other devices on a circuit board. Generally, the pin is inserted through the plated thru-hole and soldered therein. The soldering of the pin within the plated thru-hole provides for a conductive bridge between the pin and the plating of the hole. Such methods can be expensive due to the manual process of applying the solder which is required in today's high density, miniaturized components, in order to assure that the pin is soldered to the plated thru-hole. Also, this method may damage the pins and also reduce the available pin length for other interconnections. Other methods of mating a device with a circuit board without use of solder are known which require special pin geometry having protrusions to engage the plating of a plated thru-hole. Such a method requires expensive pins and tight control of plated thru-hole diameters. It is also known to have socket contacts press-fit into a plated thru-hole. Such a method is also expensive as the additional member must be press-fit into the holes requiring special insertion tooling and also require tight plated thru-hole diameter tolerances. It is known in the art to combine the above mating means with an interconnect board. It is known to use an interconnect board to provide a power/ground decoupling circuit or to alter an existing integrated circuit or add a co-processor circuit to the existing chip set. However, prior art methods used to accomplish these functions have used the aforementioned plated thru-hole soldering techniques or specially designed contacts which must be added to or soldered to the individual plated thru-holes of the interconnect board which is expensive and labor intensive. Accordingly, there is desired an electrical connector apparatus which overcomes many of the aforementioned problems and would provide an inexpensive and quickly adaptable IC package. Such interconnect boards could also be used on generally known connectors to provide electro-magnetic frequency protection or filtering.

It is therefore an object of the present invention to provide a new and improved means for interconnecting devices inexpensively and quickly.

It is a further object of the present invention to provide an interconnect means which requires no soldering, no special pins or contacts.

It is another object of the present invention to provide a circuit board with an integral compliant contact.

It is a further object of the present invention to provide a interconnect board and contact having an extremely low profile.

It is a another object of the present invention to provide an interconnect means which provides for the quick modification of an IC socket or providing for a co-processor.

It is another object of the present invention to provide an interconnect board for quickly providing a power/ground decoupling circuit to an integrated circuit.

It is another object of the present invention to provide an interconnect board for providing a reduced voltage supply for an integrated circuit.

SUMMARY OF THE INVENTION

According to the above objects, the present invention provides for the use of a integral thru-hole contact comprising a substrate having a hole therethrough and protruding into the hole is a first contact and a second contact. The first and second contacts are integral with the substrate and protrude into the hole at an angle perpendicular to the direction of the hole. The first and second contacts are compliant. The first and second contacts separated by a gap having a width less than the diameter of a contact pin to be inserted therein. Upon insertion of a contact pin, the pin will abut the end portions of the contacts causing the first and second contacts to deflect in a direction parallel to the insertion direction of the contact pin. Sufficient normal forces created between the first and second contacts and the contact pin to assure sufficient electrical contact. The first and second contacts of the present invention may be formed of beryllium copper.

These and other features of the invention are set forth below in the following detailed description of the presently preferred embodiments.

BRIEF DESCRIPTION OF THE DRAWINGS

FIG. 1 is a plan view of an interconnect board of the present invention;

FIG. 2 is an enlarged view of a through-hole of the interconnect board of FIG. 1;

FIG. 3 is a side elevation cut-away view of FIG. 1, taken at line 3—3;

FIG. 4 is an enlarged view of FIG. 3, taken at Section 4;

FIG. 5 is a side elevation cut-away view of the interconnect board of the present invention mated to an IC package which is mounted to a socket; and FIG. 6 is an enlarged view of FIG. 5.

DETAILED DESCRIPTION OF THE PRESENTLY PREFERRED EMBODIMENTS

The present invention is best understood by reference to FIGS. 1–6. FIGS. 1–4 show a first embodiment and FIGS. 5–6 a second embodiment of the invention. FIG. 1 shows an interconnect board 10 having thru-holes 20. The array of thru-holes 20 are oriented according to the pin layout of standard IC packages. The embodiment of FIG. 1 includes an array which corresponds to the pins of an Intel DX4 Co-fried Ceramic pin grid array package having 169 thru-holes. However, the present invention may include an array of thru-holes which correspond to any IC package having pins such as a pin grid array package. Some of the thru-holes 20 will be a normal pass-thru hole, whereas other thru-holes 20 include a contact. The orientation and number of thru-holes 20' having contacts will be determined by the function desired of the interconnect board 10. The purpose of a preferred embodiment shown in FIG. 1 is to provide a power to ground decoupling circuit and the thru-hole contacts are oriented to correspond with the power pins of the IC package to which the interconnect board 10 will be mated. However, any orientation or number of thru-hole contacts 20' may be possible according to the present invention.

FIG. 2 is an enlarged view of the thru-hole contact 21. The thru-hole contact 21 includes an open aperture 22. This aperture 22 may be formed simply by drilling or by a plated thru-hole. Protruding from the sides of the thru-hole 21 are a first contact 31 and a second contact 32. The first and second contact 31,32 protrude perpendicular to the bore of the aperture 22 and toward the center line 25 of the thru-hole contact 21. However, the first and second contacts 31,32 do not extend all the way up to the center line 25 and a gap 27 is provided between the first and second contacts 31,32. A pin of an IC package is received by the thru-hole contact 21 at the gap 27. The thru-hole contact 21 is constructed as described below so that upon insertion of a pin of an IC package through the aperture 22, the contacts 31,32 will flex and allow the pin of an IC package to pass through the aperture 22. In a preferred embodiment, the thru-hole contact 21 has a diameter of 0.040 inches and the contacts 31,32 have a width of 0.025 inches and the gap 27 is approximately 0.004 inches. A standard pin of an IC package has a diameter of 0.018 inches so that deflection of the contacts 31,32 is assured. The interconnect board 10, in a preferred embodiment, is 1.750 inches square and the thru-holes 20 are on 0.100 inch spacing.

In an alternative embodiment, the thru-hole contact 21 may have only a single contact protruding perpendicular to the bore of the aperture 22 and toward the centerline 25. A pin inserted within the aperture 22 will be frictionally held between the side of the aperture 22 and the single contact to provide a constant electrical connection. An array of thru-hole contacts having a single contact, each in a different X-Y orientation, may provide for a stable retention of an IC package. For example, a first hole may have an east facing contact, a second hole having a South facing contact, a third hole having a West facing contact, and a fourth hole having a North facing contact. In a further alternative embodiment, the thru-hole contact may have more than two contacts.

FIG. 3 is a side elevation view of FIG. 1, taken at line 3—3. The interconnect board 10 is shown having pass thru-hole 20 and contact hole 21. FIG. 3 discloses an embodiment of the present invention having the contacts in the contact holes at a first plane 41 and a second plane 42. The two planes of the contacts 41,42 provide separate circuit planes to provide for power/ground decoupling circuit.

Turning to FIG. 4, an enlarged view of area 4 of FIG. 3 is shown. The interconnect board 10 includes contact holes 21 having contacts on a first plane 41 and a second plane 42. In a preferred embodiment, the first plane 41 is the ground plane and the second plane 42 is the power plane. The first and second planes 41,42 are connected via conductive paths, or traces, to decoupling capacitors mounted to the interconnect board 10 to provide added capacitance. The first plane 41 or second plane 42 may be connected to other areas on the interconnect board 10 by extending the plane through the interconnect board or by having a conductive trace or plated via hole connected to the plane. In an alternative embodiment, the contact plane may be only a small portion, such as contact 33 which protrudes into the thru-hole and only runs through the interconnect board 10 a short distance. The noncontacting end 35 of the contact 33 is inserted in the dielectric substrate 50 of a length sufficient to provide the contact end 34 with a flexing motion. A ratio of the length of the exposed contact end 34 to the non-contacting end 35 is approximately 1:2. Such short contacts 33 may be used anywhere in the interconnect board and connection to other pans of the board from the short contact 33 can be achieved by having conductive traces attached thereto.

The method of assembly of the interconnect board is by assembling the board in layers. Generally, the interconnect board 10 is made of a dielectric layer 50 of such a material as Kapton. This dielectric material has a low dielectric constant. As the desired result of the embodiment of the interconnect board shown in FIG. 4 is to provide a decoupling plane, there is desired a high dielectric constant between the first and second planes 41,42 and to achieve a large capacitance. Therefore, the intermediate layer 51 is of a material having a high dielectric constant, and in any event, higher than the dielectric constant of the outside layers 50. As well, the intermediate layer 51 is thinner than the outside layers 50 to provide a greater capacitance. After assembly of the multiple layers of the interconnect board 10, the thru-holes 21 are formed by laser removal of the dielectric material above the contacts at the thru-hole 21. In an alternative procedure, the dielectric layer may be etched out. As shown in FIG. 4, the dielectric bottom layer may remain intact in the hole 21 below the contacts. The dielectric layer 50 is thin enough and flexible enough to allow the contacts to flex upon mating with a pin of an IC package. However, an alternative method of forming the interconnect board may include flipping the board and removing the dielectric layer from the bottom side of the contact in the thru-hole 21 as well.

FIGS. 5–6 show an alternative embodiment of the interconnect board as that shown in FIGS. 1–4. Also, the interconnect board is shown in its mated state with an IC package 60, unlike FIGS. 1–4, in which the interconnect board was shown in a non-mated state. The interconnect board 10 is shown mated to the pins 61 of the IC package 60. In the alternative embodiment shown in FIG. 5, the combination of the IC package 60 having the interconnect board 10 mounted thereon is then mounted to a socket 70. The alternative embodiment shown here provides the function of upgrading a microprocessor chip to change from a 5 to a 3 volt power supply. Merely by sliding the interconnect board 10 onto the pins 61 of the IC package 60 provides for an upgraded IC or provides a co-processor for additional functions. Prior art methods required either complete reconfiguration of the IC package, including the integrated circuit or elaborate modification via a corresponding socket having customized pins corresponding to the IC package. The present invention allows for the interconnect board merely to be slipped onto the pin 61 of the IC package 60 and no soldering is necessary. The interconnect board has a thickness of approximately 0.015 inches. Thus, wherein the average pin length 61 of the IC package 60 is 0.200 inches, there is still a great proportion of the length of the pin 61 protruding for insertion or mating to a socket 70 or printed circuit board. The easy mating of the interconnect board 10 to the IC package 60 provides for an easily upgradable microprocessor which may be accomplished by the end consumer or by a pan supplier who may add the interconnect board 10 at any point in time because soldering is not necessary. In prior art methods, hand soldering of sockets to the pin 61 of the IC package 60 was required in order to be sure that the maintaining of proper pin length and gold plating on the pins was retained. The present invention which does not require soldering avoids all of the expensive hand labor required by prior an methods.

In the embodiment of FIG. 5, a regulator 61 is attached to the top side of the interconnect board 10. In a preferred embodiment, a bare chip is used which is wire bonded to the interconnect board to provide a low profile. As the pin 61 of the IC package 60 generally includes stand-offs, the attachment of devices such as the regulator 61, having a profile of less than 0.050 inches will not undesirably increase the overall thickness of the IC package/interconnect board combination. Other components 62 may be surface mounted onto the bottom side of the interconnect board 10. A component set having elements such as voltage regulator, capacitors, resistors or diodes may provide the voltage reduction function of this embodiment. As the overall width of the package is determined by the length of the pins 71 of the socket 70, the height of the components 62 is a crucial dimension. Generally, the socket 70 has a height of 0.300 inches and most components 62 will have a height of less than that thickness, leaving an insertable pin length of the socket pins 71 of 0.150 inches. The entire thickness of the combination of the interconnect board 10 mounted to the IC package 60 and mounted to the socket 70 is 0.300 inches, plus the 0.150 inch pin length of the end of the pins 71. In a preferred embodiment, the socket 70 is a low insertion force, pin grid array socket.

FIG. 6 is an enlarged view of FIG. 5 showing a single end of the combination of the interconnect board 10 mounted to the IC package 60 and inserted in socket 70. The pin 61 of the IC package 60 is inserted into thru-hole 21 and abuts contacts 31,32. Upon insertion of the pin 61, the contacts 31,32 are flexed downwardly, so that the contact pin 61 passes through the thru-hole 21. The contacts 31,32 have a sufficient normal force against the pin 61 so that a constant electrical contact is maintained between the contacts 31,32 and the contact pin 61 of the IC package. In a preferred embodiment, the contacts 31,32 may deflect at least 15° from a resting state perpendicular to the thru-hole 21 while maintaining a normal force of at least 0.50 oz. The interconnect board 10 is shown with a single contact plane 43. However, as discussed earlier, the interconnect board 10 may have multiple contact planes or the contacts 31,32 may be formed of small contacts dedicated only to the specific thru-hole 21.

The socket 70 includes standard screw-hole pins 71 into which the pin 61 of the IC package 60 are received. The embodiment disclosed only requires that the power pins be affected and therefore, certain contact pins of the socket 70 will be eliminated so that a blank 73 is formed in the socket 70. In a preferred embodiment, the contacts 31,32 are formed of a beryllium copper. If a single plane 43 is used, the plane my be oriented at any depth or level of the interconnect board 10. As shown in FIG. 6, the plane 43 is oriented closer to the bottom of the interconnect board 10. Upon bending of the contacts 31,32, they may protrude out of thru-hole 21 beyond the bottom surface of the interconnect board 10. Thus, the thickness of the interconnect board in its mated condition may be dependant upon the orientation or level of the contact plane 43 within the interconnect board 10. By moving the contact plane 43 up or close to the top surface of the interconnect board 10, the deflection of the contacts 31,32 will not extend beyond the thru-hole 21 and the overall width of the interconnect board 10 will be dependant only upon the width of the dielectric layer of the board. The dielectric material of the interconnect board 10 is generally a material similar to that of the socket to which the interconnect board will be mounted so that no heat-shrink problems will occur. In alternative embodiments of the present invention, additional circuit layers may be added to the interconnect board 10 to add functions and upgrades to the IC package. As these additional layers are extremely thin compared to the contact plane, this can easily be done without adding to the overall width of the interconnect board. Should an interconnect board having multiple functions be needed which give a greater thickness, the interconnect board can easily be mounted to sockets having longer than normal pins.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

What is claimed is:

1. An electrical connector comprising:
   an interconnect board having an array of thru-holes, the interconnect board including a first non-plated thru-hole having a ground plane forming a first integral contact protruding from and generally perpendicular to a first side of said first thru-hole and a power plane separated from said ground plane by a dielectric layer, the power plane forming a second integral contact protruding from and generally perpendicular to a second non-plated thru-hole wherein upon insertion of pins in the first and second thru-holes, the first and second contacts will flex and provide a compression fit to the contact pin.

2. The electrical connector of claim 1 wherein said contacts are formed of beryllium copper.

3. The electrical connector of claim 1 wherein a plurality of said thru-hole contacts are oriented in an array on an interconnect board.

4. The electrical connector of claim 3 wherein said interconnect board includes components for upgrading a microprocessor from 5 to 3 volts.

5. The electrical connector of claim 3 wherein an intermediate layer of high dielectric material is formed in said interconnect board.

6. The electrical connector of claim 3 wherein said interconnect board has an overall thickness of less than 0.010 inches.

7. The electrical connector of claim 3 wherein said interconnect board provides a power-ground decoupling circuit.

8. The electrical connector of claim 3 wherein the interconnect board includes 169 hole locations.

9. An interconnect board comprising a ground plane, a power plane separated from the ground plane by a dielectric layer and an array of thru-holes located in said interconnect board, said at least one non-plated thru-hole having a contact integrally formed with the ground plane and mounted and generally perpendicular to said non-plated thru-hole wherein a solderless electrical interconnect is achieved.

10. The interconnect board of claim 9 wherein a second contact is formed of a power plane.

11. The interconnect board of claim 9 wherein the power plane and the ground plane are formed within said interconnect board.

* * * * *